(12) United States Patent
Aoi (10) Patent No.: US 6,873,052 B2
(45) Date of Patent: Mar. 29, 2005

(54) POROUS, FILM, WIRING STRUCTURE, AND METHOD OF FORMING THE SAME

(75) Inventor: Nobuo Aoi, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 51 days.

(21) Appl. No.: 10/608,126

(22) Filed: Jun. 30, 2003

(65) Prior Publication Data

US 2004/0000718 A1 Jan. 1, 2004

Related U.S. Application Data

(62) Division of application No. 10/126,687, filed on Apr. 22, 2002, now Pat. No. 6,602,802, which is a division of application No. 09/492,349, filed on Jan. 27, 2000, now Pat. No. 6,387,824.

(30) Foreign Application Priority Data

Jan. 27, 1999 (JP) .............................................. 11-17914

(51) Int. Cl.⁷ ............................................. H01L 23/48
(52) U.S. Cl. ..................... 257/760; 257/761; 257/762; 257/763; 257/764; 257/765; 438/637; 438/672
(58) Field of Search .................................. 257/760–768, 257/700–705; 438/637–640, 672–775

(56) References Cited

U.S. PATENT DOCUMENTS

| | | | |
|---|---|---|---|
| 5,965,202 A | 10/1999 | Taylor-Smith et al. | |
| 6,127,258 A | 10/2000 | Watanabe | |
| 6,197,696 B1 | 3/2001 | Aoi | |
| 6,387,824 B1 | 5/2002 | Aoi | |
| 6,399,177 B1 * | 6/2002 | Fonash et al. | ............... 428/119 |

\* cited by examiner

Primary Examiner—Dung A. Le
(74) Attorney, Agent, or Firm—Donald R. Studebaker; Nixon Peabody LLP (57) ABSTRACT

An organic-inorganic hybrid film is deposited on a substrate by introducing, into a vacuum chamber, a gas mixture of a silicon alkoxide and an organic compound and generating a plasma derived from the gas mixture. Then, a hydrogen plasma process is performed with respect to the organic-inorganic hybrid film by introducing, into the vacuum chamber, a gas containing a reducing gas and generating a plasma derived from the gas. As a result, an organic component in the organic-inorganic hybrid film eliminates therefrom and numerous fine holes are formed in hollow portions from which the organic component has eliminated, whereby a porous film composed of the organic-inorganic hybrid film is obtained.

14 Claims, 8 Drawing Sheets

POROUS, FILM, WIRING STRUCTURE, AND METHOD OF FORMING THE SAME

This application is a Division of Ser. Nos. 10/126,687 Apr. 22, 2002 U.S. Pat. No. 6,602,802 which is a Division of Ser. No. 09/492,349 Jan. 27, 2000 U.S. Pat. No. 6,387,824.

BACKGROUND OF THE INVENTION

The present invention relates to a method of forming a porous film used as, e.g., an inter-layer dielectric in a semiconductor integrated circuit device.

As the integration density of a semiconductor integrated circuit has increased, an increased wiring delay time resulting from an increase in wire-to-wire capacitance, which is a parasitic capacitance between metal wires, has presented an obstacle to the implementation of a semiconductor integrated circuit with higher performance. The wiring delay time is a so-called RC delay which is proportional to the product of the resistance of the metal wire and the wire-to-wire capacitance.

To reduce the wiring delay time, therefore, it is necessary to reduce the resistance of the metal wire or the wire-to-wire capacitance.

As a method of reducing the wire-to-wire capacitance, the reduction of the dielectric constant of an inter-layer dielectric formed between the metal wires has been considered. As an inter-layer dielectric having a low dielectric constant, a porous film has been under study as a replacement for a conventional silicon oxide film. It can be said that the porous film is only the film capable of providing a dielectric constant of 2.0 or lower.

In view of the foregoing, there have been proposed various methods of forming porous films.

As a first conventional method of forming a porous film, there has been known one wherein a solution of a siloxane polymer precursor containing a thermally unstable organic component is prepared and coated on a substrate to form a coated film, which is then subjected to a thermal process for decomposing and eliminating the organic component such that numerous fine holes are formed in hollow portions from which the organic component has eliminated.

As a second conventional method of forming a porous film, there has been known one wherein a wet gel is formed on a substrate by coating a silica sol solution on the substrate or by performing CVD and then the condensation reaction of the silica sol is caused in the wet gel, while the volume reduction of the wet gel is suppressed by controlling the speed at which the solvent eliminates from the wet gel, thus forming the porous film.

As a third conventional method of forming a porous film, there has been known a method wherein a solution of silica fine particles is coated on a substrate to form a coated film, which is then sintered such that numerous fine holes are formed between the adjacent silica fine particles.

However, the first conventional method has the problem of higher cost since it is necessary to prepare the solution of the siloxane polymer precursor. Moreover, since the coated film is formed by coating the precursor solution on the substrate, the amount of silanol remaining, in the coated film is increased to cause such problems as a degassing phenomenon which is the elimination of moisture or the like in a thermal process step performed subsequently and the degradation of the porous film resulting from the absorption of moisture by the film.

On the other hand, the second conventional method has the problem of higher cost since it requires a special coating apparatus for controlling the speed at which the solvent eliminates from the wet gel. Moreover, since a large number of silanol groups remain on the surfaces of the fine holes, they may cause serious degradation of the film because of high moisture absorption, unless they are removed. It is therefore necessary to silylate the surfaces of silanol groups, resulting in a complicated process. In the case of forming the wet gel by CVD, a special CVD apparatus different from a plasam CVD apparatus used normally in a semiconductor process is also required, which also increases cost.

In accordance with the third conventional method, the diameters of the fine holes formed between the adjacent silica fine particles are determined by a geometric configuration in which the silica fine particles are deposited so that the diameters of the fine particles are increased significantly. Accordingly, it is difficult to adjust the dielectric constant of the porous film to 2 or less.

SUMMARY OF THE INVENTION

It is therefore an object of the present invention to solve the forgoing problems at once and allow the formation of a porous film having a dielectric constant of 2 or less in a simple process at low cost.

To attain the above object, a first method of forming a porous film according to the present invention comprises the steps of: depositing an organic-inorganic hybrid film on a substrate by plasma enhanced CVD using a gas mixture of a silicon alkoxide and an organic compound as a reactive gas; and forming a porous film composed of the organic-inorganic hybrid film by performing a plasma process using a plasma derived from a gas containing a reducing gas with respect to the organic-inorganic hybrid film.

In accordance with the first method of forming a porous film, the organic-inorganic hybrid film is deposited by plasma enhanced CVD using the gas mixture of the silicon alkoxide and the organic compound. Accordingly, a low-cost material can be used to deposit the organic-inorganic hybrid film. Since the plasma process is performed by using the reducing gas with respect to the organic-inorganic hybrid film deposited by plasma enhanced CVD, the decomposed organic component eliminates and the numerous fine holes are formed in the hollow portions from which the organic compound has eliminated. This ensures the formation of the porous film composed of the organic-inorganic hybrid film and allows molecular-level control of the diameters of the fine holes in the porous film.

A second method of forming a porous film according to the present invention comprises the steps of: depositing an organic-inorganic hybrid film on a substrate by plasma enhanced CVD using a gas mixture of a silicon alkoxide and an organic compound as a reactive gas; and forming a porous film composed of the organic-inorganic hybrid film by performing a thermal process with respect to the organic-inorganic hybrid film in an atmosphere containing a reducing gas.

In accordance with the second method of forming a porous film, the organic-inorganic hybrid film is deposited by plasma enhanced CVD using the gas mixture of the silicon alkoxide and the organic compound. Accordingly, a low-cost material can be used to deposit the organic-inorganic hybrid film. Since the thermal process is performed with respect to the organic-inorganic hybrid film in the atmosphere containing the reducing gas, the decomposed organic component eliminates and the numerous fine holes are formed in the hollow portions from which the organic component has eliminated. This ensures the formation of the porous film of the organic-inorganic hybrid film and allows molecular-level control of the diameters of the fine holes in the porous film.

In accordance with the first or second method of forming a porous film, there is formed the porous film composed of the organic-inorganic hybrid film deposited by plasma enhanced CVD using the gas mixture of the silicon alkoxide and the organic compound. This obviates the necessity for a precursor solution, which is indispensable to the deposition of an organic-inorganic hybrid film by coating, and allows the deposition of the organic-inorganic hybrid film using a low-cost material. Consequently, the cost of the porous film is reduced.

Moreover, since the organic component in the organic-inorganic hybrid film is eliminated by the plasma process using the plasma derived from the gas containing a reducing gas or by the thermal process performed in the gas atmosphere containing the reducing gas and the fine holes are formed in the hollow portions from which the organic component has eliminated, the fine holes having molecular-size diameters can be formed and the dielectric constant of the porous film is reduced reliably.

Furthermore, since the organic-inorganic hybrid film is deposited by plasma enhanced CVD, the amount of remaining silanol is reduced significantly compared with an organic-inorganic hybrid film deposited by coating, so that moisture generated from the remaining silanol is reduced significantly. This reduces moisture which will eliminate from the porous film in the thermal process subsequently performed as well as various troubles resulting from degassing.

In the first or second method of forming a porous film, the silicon alkoxide is preferably an organic silicon alkoxide represented by the general formula: $R^1Si(OR^2)_3$ where $R^1$ and $R^2$ are the same or different, each representing an alkyl group or an aryl group. The arrangement ensures the deposition of the organic-inorganic hybrid film by plasma enhanced CVD using the gas mixture of the organic silicon alkoxide and the organic compound.

In the first or second method of forming a porous film, the reducing gas preferably contains a hydrogen gas or an ammonia gas.

In the first or second method, if the reducing gas contains the hydrogen gas or the ammonia gas, a silicon atom remaining after the decomposition and elimination of the organic component is terminated by hydrogen, so that the surfaces of the fine holes formed in the hollow portions from which the organic component has eliminated become hydrophobic. As a result, moisture is prevented from entering the fine holes so that the moisture absorption resistance of the porous film is increased.

If the reducing gas contains the ammonia gas, in particular, the surface of the porous film and the surfaces of the fine holes are nitrided so that the metal composing the metal film deposited to come in contact with the porous film is less likely to be diffused in the porous film, which increases the insulation resistance of the porous film.

A third method of forming a porous film according to the present invention comprises the steps of: depositing, on a substrate, an organic-inorganic hybrid film having a siloxane skeleton; and forming a porous film composed of the organic-inorganic hybrid film by performing a plasma process using a plasma derived from a gas containing a reducing gas with respect to the organic-inorganic hybrid film.

In accordance with the third method of forming a porous film, the plasma process using the plasma derived from the gas containing the reducing gas is performed with respect to the organic-inorganic hybrid film having a siloxane skeleton. Consequently, the decomposed organic component eliminates to leave the numerous fine holes formed in the hollow portions from which the organic component has eliminated. This ensures the formation of the porous film composed of the organic-inorganic hybrid film and allows molecular-level control of the diameters of the fine holes in the obtained porous film, so that the dielectric constant of the porous film is reduced reliably.

In the third method of forming a porous film, the reducing gas preferably contains a nitrogen atom.

In the arrangement, the surface of the porous film and the surfaces of the fine holes are nitrided so that the metal composing the metal film deposited to come in contact with the porous film is less likely to be diffused in the porous film, which increases the insulation resistance of the porous film. In this case, if the reducing gas contains an ammonia gas, the surface of the porous film and the surfaces of the fine holes can be nitrided reliably.

In the third method of forming a porous film, the reducing gas preferably contains a hydrogen atom.

In the arrangement, a silicon atom remaining after the decomposition and elimination of the organic component is terminated by hydrogen so that the surfaces of the fine holes formed in the hollow portions from which the organic component has eliminated become hydrophobic. This prevents moisture from entering the fine holes and increases the moisture absorption resistance of the porous film.

In this case, if the reducing gas contains a hydrogen gas or an ammonia gas, a silicon atom remaining after the decomposition and elimination of the organic component is surely terminated by hydrogen.

A first method of forming a wiring structure according to the present invention comprises the steps of: depositing, on a substrate, an organic-inorganic hybrid film having a siloxane skeleton; forming a resist pattern on the organic-inorganic hybrid film; performing etching with respect to the organic-inorganic hybrid film masked with the resist pattern to form a depressed portion composed of a wire groove or a contact hole in the organic-inorganic hybrid film; performing a plasma process using a plasma derived from a gas containing a reducing gas with respect to the resist pattern and the organic-inorganic hybrid film to remove the resist pattern and form an inter-layer dielectric which is a porous film composed of the organic-inorganic hybrid film; and filling a metal film in the depressed portion of the inter-layer dielectric to form a buried wire or contact composed of the metal film.

In accordance with the first method of forming a wiring structure, the plasma process using the plasma derived from the gas containing the reducing gas is performed with respect to the resist pattern and to the organic-inorganic hybrid film. This allows the step of removing the resist pattern and the step of forming a porous film composed of the organic-inorganic hybrid film to be performed simultaneously. As a result, the porous film composed of the organic-inorganic hybrid film can be formed without increasing the number of process steps.

A second method of forming a wiring structure according to the present invention comprises the steps of: depositing, on a substrate, a first organic-inorganic hybrid film containing an organic component in a relatively low proportion; patterning the first organic-inorganic hybrid film to form a contact hole in the first organic-inorganic hybrid film; depositing, on the first organic-inorganic hybrid film, a second organic-inorganic hybrid film containing an organic component in a relatively high proportion; patterning the second organic-inorganic hybrid film to form a wire groove in the second organic-inorganic hybrid film; filling a metal film in the contact hole and in the wire groove to form a contact and a metal wire each composed of the metal film; and performing a porous-film forming process with respect to the first and second organic-inorganic hybrid films in an atmosphere containing a reducing gas to form a first inter-layer dielectric which is a porous film composed of the first organic-inorganic hybrid film and a second inter-layer dielectric which is a porous film composed of the second organic-inorganic hybrid film.

In accordance with the second method of forming a wiring structure, the amount of the organic component contained in the second organic-inorganic hybrid film is larger than the amount of the organic component contained in the first organic-inorganic hybrid film, so that the porosity of the second organic-inorganic hybrid film is higher than the porosity of the first organic-inorganic hybrid film. As a result, the second inter-layer dielectric is lower in dielectric constant than the first inter-layer dielectric. Moreover, the first inter-layer dielectric is higher in mechanical strength and heat conductivity than the second inter-layer dielectric. Accordingly, a wire-to-wire parasitic capacitance produced between the metal wires formed in the second inter-layer dielectric is reduced and heat generated in the metal wires is diffused efficiently into the substrate via the first inter-layer dielectric. Furthermore, since the wiring structure retains sufficient mechanical strength with the first inter-layer dielectric excellent in mechanical strength, it is possible to reduce the dielectric constant of the inter-layer dielectric, while retaining the sufficient mechanical strength of the wiring structure.

A third method of forming a wiring structure according to the present invention comprises: depositing, on a substrate, an organic-inorganic hybrid film having a siloxane skeleton; patterning the organic-inorganic hybrid film to form a wire groove in the organic-inorganic hybrid film; filling a metal film in the wire groove to form a buried wire composed of the metal film; and performing a plasma process using a plasma derived from a gas containing a reducing gas with respect to the organic-inorganic hybrid film to form an inter-layer dielectric which is a porous film composed of the organic-inorganic hybrid film.

In accordance with the third method of forming a wiring structure, the inter-layer dielectric composed of the porous film is formed by forming the buried wire and then performing the plasma process using the reducing gas with respect to the organic-inorganic hybrid film, so that the metal composing the buried wire is prevented from entering the fine holes in the inter-layer dielectric. This prevents an increased leakage current and a short circuit between the buried wires. Since it is unnecessary to form a protecting film in the wiring groove, the wire-to-wire parasitic capacitance between the buried wires can be reduced reliably.

A wiring structure according to the present invention comprises: a first inter-layer dielectric formed on a substrate and having a contact hole, the first inter-layer dielectric being composed of a porous film having a relatively low porosity; a second inter-layer dielectric formed on the first inter-layer dielectric and having a wire groove, the second inter-layer dielectric being composed of a porous film having a relatively high porosity; a contact composed of a metal film filled in the contact hole; and a metal wire composed of a metal film filled in the wire groove.

In the wiring structure according to the present invention, the porosity of the second inter-layer dielectric is higher than the porosity of the first inter-layer dielectric, so that the second inter-layer dielectric is lower in dielectric constant than the second inter-layer dielectric and higher in mechanical strength and heat conductivity than the first inter-layer dielectric. As a result, it is possible to reduce the dielectric constant of the inter-layer dielectric and retain the sufficient mechanical strength and heat diffusing property of the wiring structure.

BRIEF DESCRIPTION OF THE DRAWINGS

FIGS. 1(a) and (b) are diagrams of an organic-inorganic hybrid film obtained by a method of forming a porous film according to a first embodiment of the present invention;

FIGS. 2(a) and (b) are diagrams of a porous film obtained by the method of forming a porous film according to the first embodiment;

FIGS. 8(a), (b), and (c) are cross-sectional views illustrating the individual process steps of the method of forming a wiring structure according to the seventh embodiment.

DETAILED DESCRIPTION OF THE INVENTION

Embodiment 1

In accordance with a method of forming a porous film according to a first embodiment of the present invention, an organic-inorganic hybrid film is formed by plasma enhanced CVD using, as a reactive gas, a gas mixture of a silicon alkoxide gas and an organic compound gas and then a plasma process is performed with respect to the organic-inorganic hybrid film by using a plasma derived from a gas containing a reducing gas.

First, a gas mixture of a gas obtained by vaporizing vinyltrimethoxysilane (flowrate: 1 ml/min) as the silicon-alkoxide and an acetylene gas (flow rate: 100 sccm) as the organic compound gas is introduced under pressure of 1.0 Torr into a vacuum chamber. On the other hand, RF power of 13.56 MHz is applied with electric power of 500 W between counter electrodes to generate a plasma derived from the gas mixture, whereby the organic-inorganic hybrid film having a siloxane skeleton and a thickness of 320 nm is deposited on a substrate. The plasma enhanced CVD process was performed at 400° C. for 1 minute.

Figures 1A, 1B:
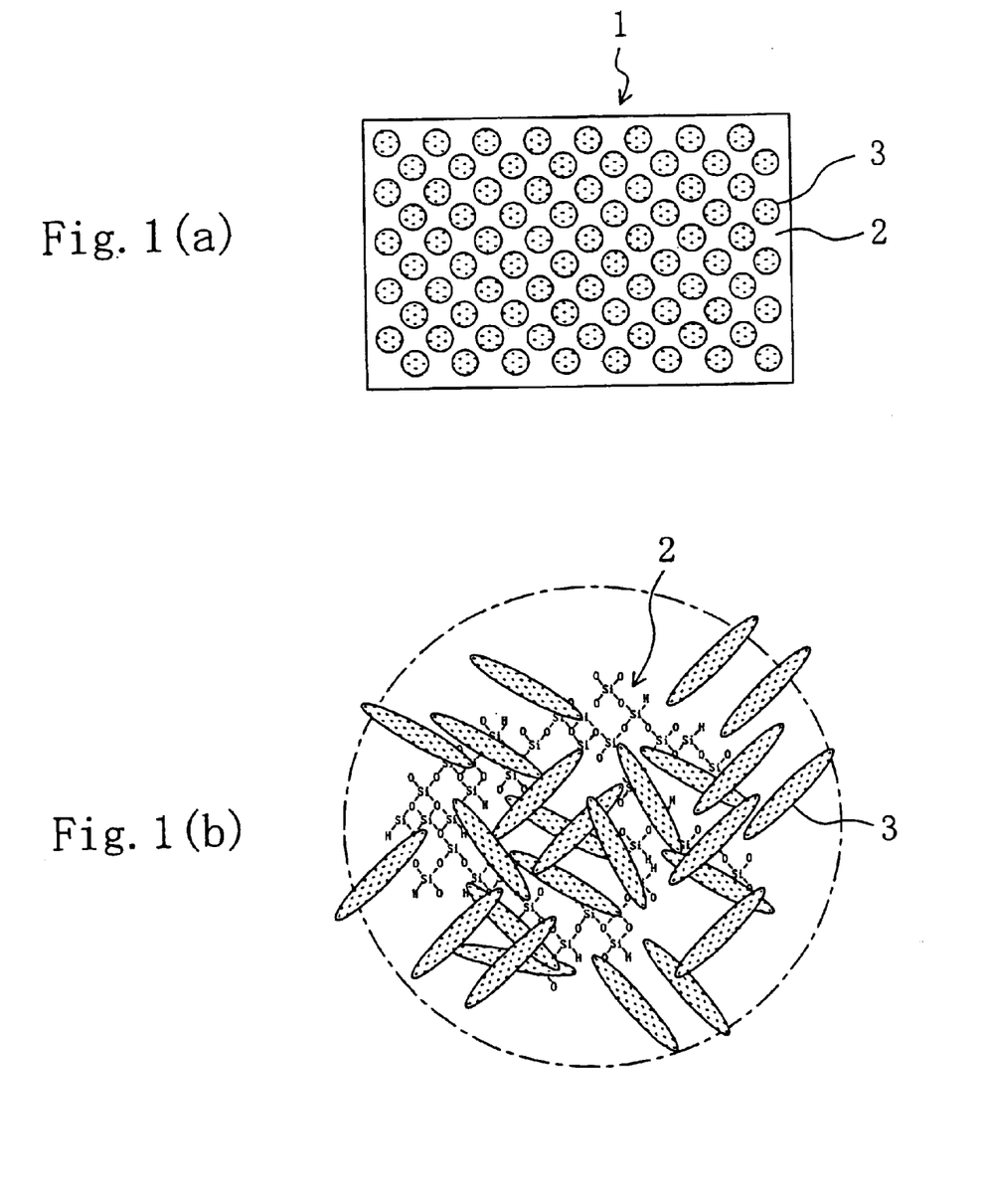

FIGS. 1(a) and (b) show diagrammatic structures of an organic-inorganic hybrid film 1, in which 2 denotes the siloxane skeleton and 3 denotes an organic component.

As a result of measuring the IR absorption spectrum of the deposited organic-inorganic hybrid film, the organic-inorganic hybrid film was recognized as a silicon oxide film containing the organic component. The dielectric constant of the organic-inorganic hybrid film was measured by CV measurement to be 3.2.

Subsequently, a gas mixture of a hydrogen gas (flow rate: 1000 sccm), a nitrogen gas (flow rate: 1000 sccm), and an oxygen gas (flow rate: 100 sccm) is introduced under pressure of 4 Torr into the vacuum chamber. On the other hand, RF power of 13.56 MHz is applied with electric power of 600 W between the counter electrodes to perform a hydrogen plasma process with respect to the organic-inorganic hybrid film. The hydrogen plasma process was performed at 400° C. for 5 minutes.

The IR absorption spectrum of the organic-inorganic hybrid film after the hydrogen plasma process was measured, with the result that an absorption peak derived from the organic component was barely observed and an absorption peak derived from a silicon-hydrogen bond (Si—H) was increased. This indicates that the hydrogen plasma process has decomposed the organic component and terminated a part of the silicon in the siloxane skeleton by hydrogen.

According to the first embodiment, the decomposed organic component in the organic-inorganic hybrid film after the hydrogen plasma process eliminates therefrom and numerous fine holes are formed in hollow portions from which the organic component has eliminated, whereby a porous film is obtained. In this case, since the fine holes are formed in the hollow portions from which the organic component has been removed, the diameters of the fine holes can be controlled on the molecular level.

Figures 2A, 2B:
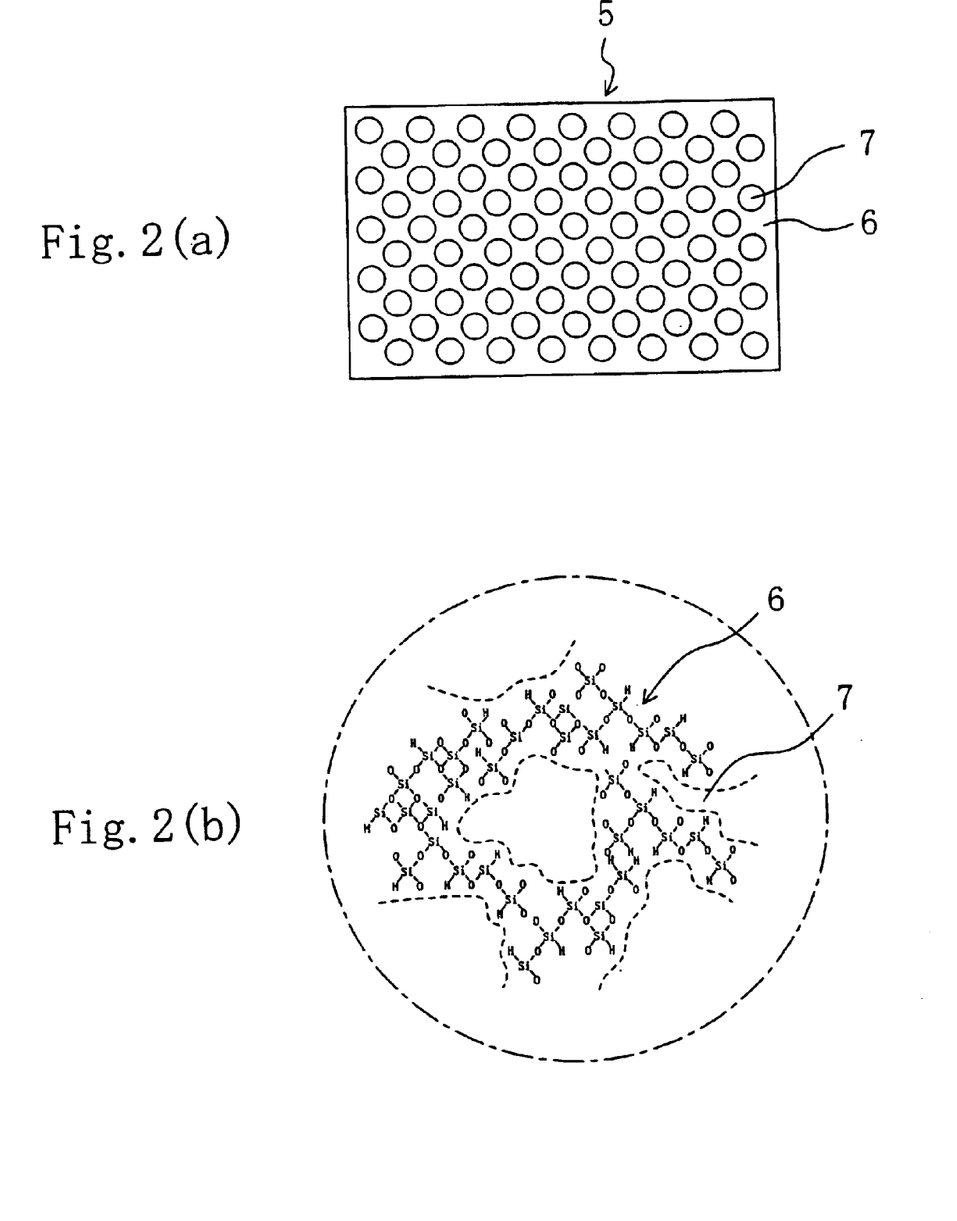

FIGS. 2(a) and (b) show diagrammatic structures of a porous film 5, in which 6 denotes the siloxane skeleton and 7 denotes the fine holes. As can be seen from the comparison between FIGS. 1(a) and (b) and FIGS. 2(a) and (b), the fine holes 7 are formed in the hollow portions from which the organic component 3 has eliminated.

Since the first embodiment has performed the plasma process with respect to the organic-inorganic hybrid film by using the plasma derived from the reducing gas, a silicon atom composing an inorganic component remaining after the decomposition and elimination of the organic component in the organic-inorganic hybrid film is terminated by hydrogen. As a result, surfaces of the fine holes formed in the hollow portions from which the organic component has eliminated become hydrophobic and moisture is prevented from entering the fine holes. Accordingly, the porous film is less likely to absorb moisture.

Thus, the first embodiment allows molecular-level control of the diameters of the fine holes and low-cost formation of a porous film with high moisture absorption resistance by cost-effective plasma enhanced CVD.

In the first embodiment, the step of depositing the organic-inorganic hybrid film and the step of forming the porous film composed of the organic-inorganic hybrid film may be performed by the same plasma enhanced CVD apparatus or by different plasma enhanced CVD apparatus.

A reduction in the thickness of the porous film obtained in accordance with the first embodiment was on the order of several percent and the dielectric constant of the porous film was 1.7.

The porosity of the porous film was calculated to be 75% from the density thereof. The porosity can be controlled by changing the amounts of vinyltrimethoxysilane and acetylene to be introduced. However, the maximum amount of the acetylene gas that can be introduced is limited to the range in which the siloxane skeleton can be formed. If the formation of the siloxane skeleton is unsatisfactory due to an excessively large amount of the organic component introduced, the percentage of film shrinkage caused by the hydrogen plasma process is increased so that it is difficult to form an excellent porous film.

As the temperature for the hydrogen plasma process becomes higher, the speed at which the organic component is removed is increased, while the percentage of film shrinkage tends to increase as well. Although the first embodiment has performed the hydrogen plasma process at a temperature of 400° C., a practical removal speed can be achieved even at a temperature of about 200° C.

Embodiment 2

In accordance with a method of forming a porous film according to a second embodiment of the present invention, an organic-inorganic hybrid film is formed by plasma enhanced CVD, using, as a reactive gas, a gas mixture of a silicon alkoxide gas and an organic compound gas and then a thermal process is performed with respect to the organic-inorganic hybrid film in an atmosphere containing a reducing gas.

First, the organic-inorganic hybrid film is formed by plasma enhanced CVD using, as the reactive gas, a gas mixture of a gas obtained by vaporizing vinyltrimethoxysilane as the silicon alkoxide and an acetylene gas as the organic compound gas, similarly to the first embodiment.

Next, a thermal process at a temperature of about 400° C. is performed with respect to the organic-inorganic hybrid film by using, e.g., an electric furnace in an atmosphere containing a reducing gas which is composed of a gas mixture of a hydrogen gas, a nitrogen gas, and an oxygen gas.

According to the second embodiment, the organic component is decomposed by the thermal process in the atmosphere containing the reducing gas to eliminate and numerous fine holes are formed in hollow portions from which the decomposed organic component has eliminated, whereby a porous film is obtained. In this case, since the fine holes are formed in the hollow portions from the organic component has been removed, the diameters of the fine holes can be controlled on the molecular level.

Moreover, since the second embodiment has performed the thermal process with respect to the organic-inorganic hybrid film in the atmosphere containing the reducing gas, a silicon atom composing an inorganic component remaining after the decomposition and elimination of the organic component is terminated by hydrogen. Accordingly, the porous film is less likely to absorb moisture.

Thus, the second embodiment allows molecular-level control of the diameters of the fine holes and low-cost formation of a porous film with high moisture absorption resistance by cost-effective plasma enhanced CVD.

Embodiment 3

In accordance with a method of forming a porous film according to a third embodiment of the present invention, an organic-inorganic hybrid film is formed by plasma enhanced CVD using, as a reactive gas, a gas mixture of a silicon alkoxide gas and an organic compound gas and then a plasma process is performed with respect to the organic-inorganic hybrid film using a plasma derived from an ammonia gas and an oxygen gas.

First, the organic-inorganic hybrid film is formed by plasma enhanced CVD using, as the reactive gas, a gas mixture of a gas obtained by vaporizing vinyltrimethoxysilane as the silicon alkoxide and an acetylene gas as the organic compound gas, similarly to the first embodiment.

Next, a gas mixture of an ammonia gas (flow rate: 100 sccm), an argon gas (flow rate: 1000 sccm) as a dilute gas, and an oxygen gas (flow rate: 100 sccm) is introduced under pressure of 5 Torr into a vacuum chamber and RF power of 13.56 MHz is applied with electric power of 500 W between counter electrodes to perform an ammonia plasma process with respect to the organic-inorganic hybrid film. The ammonia plasma process is performed at a temperature of 400° C. for 10 minutes.

According to the third embodiment, the organic component is decomposed by the ammonia plasma process to eliminate and numerous fine holes are formed in hollow portions from which the decomposed organic component has eliminated, whereby a porous film is obtained.

Moreover, since the third embodiment has performed the ammonia plasma process, a silicon atom composing an inorganic component remaining after the decomposition and elimination of the organic component is nitrided. Accordingly, the porous film is less likely to absorb moisture.

Since the third embodiment also allows the formation of the organic-inorganic hybrid film by cost-effective plasma enhanced CVD, cost can be reduced.

The dielectric constant of the porous film obtained in accordance with the third embodiment was 1.9, which is slightly higher than the dielectric constant of the porous film obtained in accordance with the first embodiment.

To examine the diffusion of copper in the porous film obtained in accordance with the third embodiment, a thin film of copper was deposited on the porous film and subjected to a thermal process at a temperature of 400° C. Thereafter, the degradation of the insulation resistance of the porous film was examined. However, the degradation of the insulation resistance was not observed and it was proved that copper was barely diffused.

Although each of the first to third embodiments has used vinyltrimethoxysilane as the silicon alkoxide, an organic silicon alkoxide represented by the general formula: $R^1Si(OR^2)_3$ where $R^1$ and $R^2$ are the same or different, each representing an alkyl group or an aryl group may also be used generally instead of vinyltrimethoxysilane.

As an example of the organic silicon alkoxide represented by the general formula: $R^1Si(OR^2)_3$, there may be listed methyltrimethoxysilane ($R_1$: methyl group, $R_2$: methyl group), phenyltrimethoxysilane ($R_1$: phenyl group, $R_2$: methyl group), or ethyltrimethoxysilane ($R_1$: ethyl group, $R_2$: methyl group). In such an organic silicon alkoxide, $R_2$ may also represent an ethyl group or a phenyl group, instead of a methyl group.

Although each of the first to third embodiments has used acetylene as the organic compound gas, it is also possible to use various hydrocarbons such as hydrocarbon fluoride or compounds of carbon fluoride. Specifically, there can be listed a saturated or unsaturated compound of perfluorocarbon, hydrofluorocarbon, or hydrocarbon.

Although each of the first to third embodiments has used, as the reactive gas, the gas mixture of the gas obtained by vaporizing the silicon alkoxide and the organic compound gas, it is also possible to use a single gas obtained by vaporizing an alkoxysilane having an organic silicon bond, such as vinyltrimethoxysilane. The use of such a single film also allows the formation of the porous film, though the porosity of the film is reduced.

Embodiment 4

In accordance with a method of forming a porous film according to a fourth embodiment, a plasma process is performed with respect to an organic-inorganic hybrid film having a siloxane skeleton by using a plasma derived from a gas containing a reducing gas.

First, a coated film obtained by coating, on a substrate, phenyl siloxane as a solution having a siloxane skeleton and an organic component is subjected to a thermal process at a temperature of 400° C., whereby an organic SOG film is obtained.

As a result of measuring the IR absorption spectrum of the organic SOG film, an absorption peak derived from a silicon-phenyl bond was observed. The dielectric constant of the organic SOG film was measured to be 3.1 by CV measurement.

Next, a gas mixture of a hydrogen gas (flow rate: 1000 sccm), a nitrogen gas (flow rate: 1000 sccm), and an oxygen gas (flow rate: 100 sccm) was introduced under pressure of 4 Torr into a vacuum chamber, while RF power of 13.56 MHz was applied with electric power of 500 W between counter electrodes, whereby a hydrogen plasma process was performed with respect to the organic-inorganic hybrid film. The hydrogen plasma process was performed at a temperature of 400° C. for 5 minutes.

The IR absorption spectrum of the organic SOG film after the hydrogen plasma process was measured, with the result that the absorption peak derived from a silicon-phenyl bond was not observed at all, while an absorption peak derived from a silicon-hydrogen bond was observed. This indicates that the hydrogen plasma process has decomposed the organic component and terminated a part of the silicon in the siloxane skeleton by hydrogen.

The dielectric constant of the porous film obtained in the fourth embodiment was 1.9.

Thus, the fourth embodiment allows molecular-level control of the diameters of fine holes and low-cost formation of a porous film with high moisture absorption resistance.

Although the fourth embodiment has used an organic SOG film composed of phenylsiloxane as the organic-inorganic hybrid film having a siloxane skeleton, it is not limited to the organic SOG film.

A porous film may also be formed by performing a thermal process at a temperature of 400° C. with respect to the organic SOG film obtained in accordance with the same method as used in the fourth embodiment in an atmosphere containing a reducing gas which is composed of a hydrogen gas, a nitrogen gas, and an oxygen gas, similarly to the second embodiment.

Alternatively, a porous film may be formed by performing an ammonia plasma process with respect to the organic SOG film obtained in accordance with the same method as used in the fourth embodiment, similarly to the third embodiment.

Embodiment 5

A method of forming a wiring structure according to a fifth embodiment of the present invention will be described with reference to FIGS. 3(a), (b), and (c)

Figure 3A:
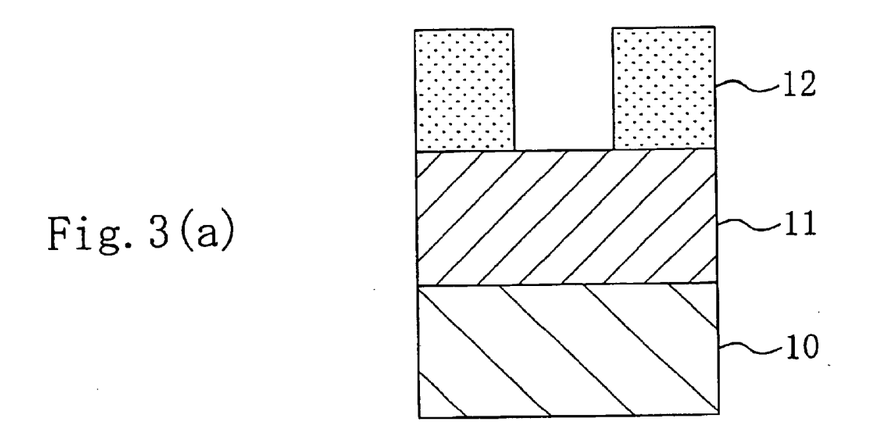
FIGS. 3(a), (b), and (c) are cross-sectional views illustrating the individual process steps of a method of forming a wiring structure according to a fifth embodiment of the present invention.
Figure 3B:
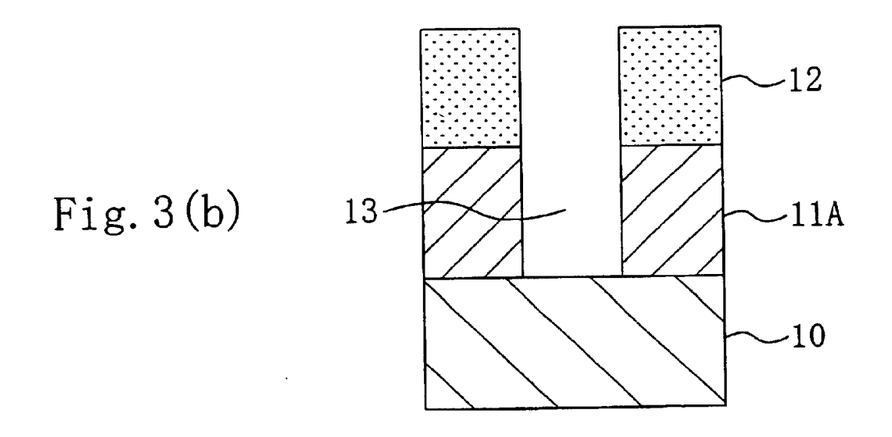
Figure 3C:
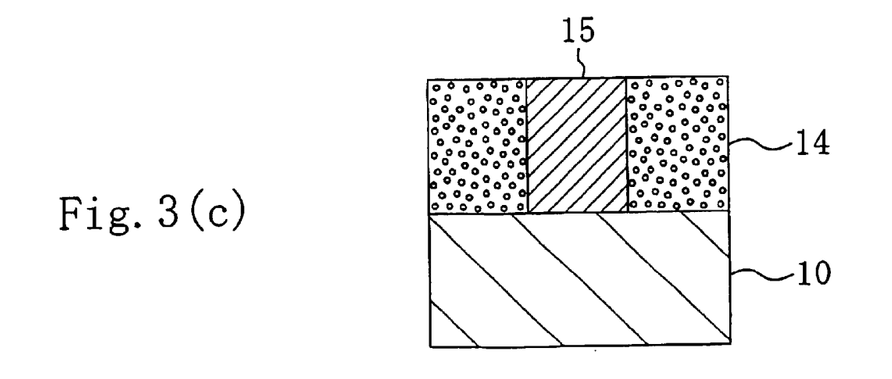

First, as shown in FIG. 3(a), an organic-inorganic hybrid film 11 having a siloxane skeleton and a thickness of, e.g., 600 nm is deposited on a semiconductor substrate 10 by the same plasma enhanced CVD as performed in the first embodiment. Then, a resist pattern 12 having an opening over the region of the organic-inorganic hybrid film 11 in which a wire groove or contact hole is to be formed is formed on the organic-inorganic hybrid film 11.

Next, as shown in FIG. 3(b), dry etching is performed with respect to the organic-inorganic hybrid film 11 masked with the resist pattern 12, thereby forming a patterned organic-inorganic hybrid film 11A having a depressed portion 13 composed of a wire groove or contact hole.

Next, the same hydrogen plasma process as performed in the first embodiment is performed with respect to the patterned organic-inorganic hybrid film 11A and the resist pattern 12 to remove the resist pattern 12 and form an inter-layer dielectric 14 which is a porous film composed of the patterned organic-inorganic hybrid film 11A.

Next, a metal film 15 such as a copper film is filled in the depressed portion of the inter-layer dielectric 14 such that a buried wire or contact composed of the metal film 15 is formed.

According to the fifth embodiment, the hydrogen plasma process allows the removal of the resist pattern 12 and the formation of the porous film composed of the patterned organic-inorganic hybrid film 11A to be performed simultaneously, so that the number of process steps for forming the wiring structure is reduced.

Embodiment 6

A method of forming a wiring structure according to a sixth embodiment of the present invention will be described with reference to FIGS. 4(a), (b), and (c).

Figure 4A:
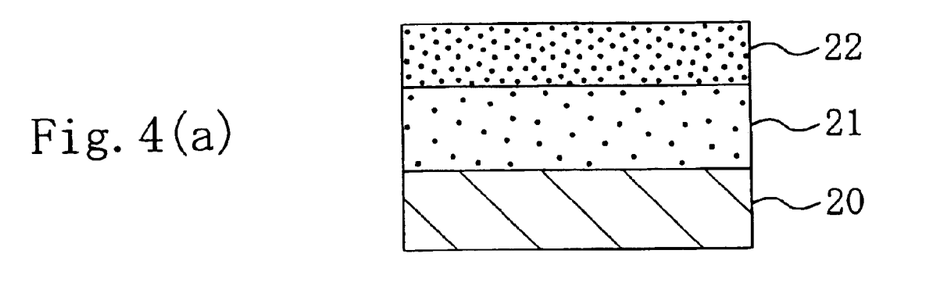
FIGS. 4(a), (b), and (c) are cross-sectional views illustrating the individual process steps of a method of forming a wiring structure according to a sixth embodiment of the present invention.
Figure 4B:
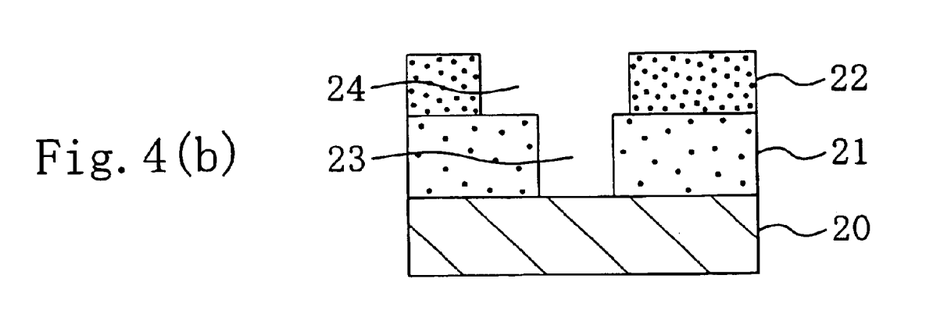
Figure 4C:
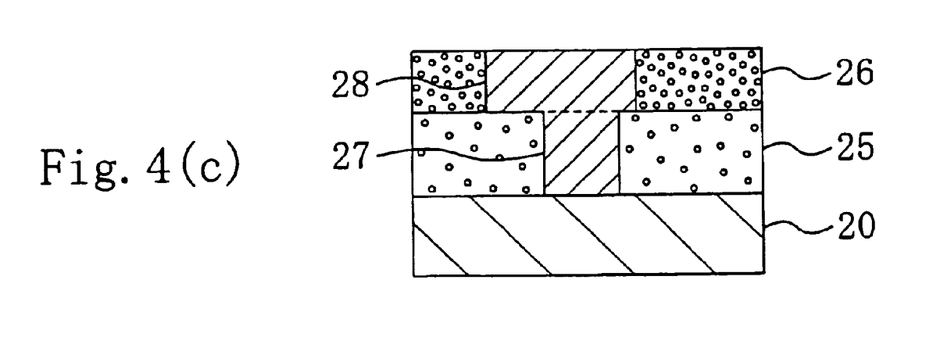

First, as shown in FIG. 4(a), a first organic-inorganic hybrid film 21 having a siloxane skeleton and a thickness of, e.g., 600 nm is deposited on a semiconductor substrate 20 by the same plasma enhanced CVD as performed in the first embodiment. Then, a second organic-inorganic hybrid film 22 having a siloxane skeleton and a thickness of, e.g., 300 nm is deposited on the first organic-inorganic hybrid film 21 by the same plasma enhanced CVD as performed in the first embodiment.

The sixth embodiment is characterized in that the amount of the organic component contained in the second organic-inorganic hybrid film 22 is adjusted to be larger than the amount of the organic component contained in the first organic-inorganic hybrid film 21. Specifically, the molar mixture ratio of an organic compound gas (acetylene gas) to a silicon alkoxide (vinyltrimethoxysilane) gas in a gas mixture introduced into a vacuum chamber is set to, e.g., 0.2 during the deposition of the first organic-inorganic hybrid film 21, while it is set to 0.5 during the deposition of the second organic-inorganic hybrid film 22. If the molar amount of the organic compound gas is A and the molar amount of the silicon alkoxide gas is B, the molar mixture ratio is defined as A/(A+B). Accordingly, the amount of the organic component to be contained in the first organic-inorganic hybrid film is reduced during the deposition thereof, while the amount of the organic component to be contained in the second organic-inorganic hybrid film is increased during the deposition thereof.

Next, as shown in FIG. 4(b), the first and second organic-inorganic hybrid films 21 and 22 are patterned such that a contact hole 23 is formed in the first organic-inorganic hybrid film 21 and a wire groove 24 is formed in the second organic-inorganic hybrid film 21.

The method of forming the contact hole 23 in the first organic-inorganic hybrid film 21 and forming the wire groove 24 in the organic-inorganic hybrid film 22 is not particularly limited. It is possible to form the contact hole 23 in the first organic-inorganic hybrid film 21, depositing the second organic-inorganic hybrid film 22, and then forming the wire groove 24 in the second organic-inorganic hybrid film 22. Alternatively, it is also possible to sequentially deposit the first and second organic-inorganic hybrid films 21 and 22 and then forming the contact hole 23 in the first organic-inorganic hybrid film 21, while forming the wire groove 24 in the second organic-inorganic hybrid film 22.

Next, the same hydrogen plasma process as performed in the first embodiment is performed with respect to the first and second organic-inorganic hybrid films 21 and 22, whereby porous films composed of the first and second organic-inorganic hybrid films 21 and 22 are formed to serve as first and second inter-layer dielectrics 25 and 26. As stated previously, since the amount of the organic component in the second organic-inorganic hybrid film 22 is larger than the amount of the organic component in the first organic-inorganic hybrid film 21, the porosity of the second inter-layer dielectric 26 is higher than that of the first inter-layer dielectric 25. Accordingly, the dielectric constant of the second inter-layer dielectric 26 is lower than that of the first inter-layer dielectric 25.

Thereafter, a copper film, e.g., is filled in the contact hole 23 in the first inter-layer dielectric 25 and in the wire groove 24 in the second inter-layer dielectric 26 to form the wiring structure in a dual damascene configuration consisting of a contact 27 and a metal wire 28.

According to the sixth embodiment, the porosity of the first inter-layer dielectric 25 is 50% and the dielectric constant thereof is 2.3. On the other hand, the porosity of the second inter-layer dielectric 26 is 85% and the dielectric constant thereof is 1.7.

Since the dielectric constant of the second inter-layer dielectric 26 filled in the metal wires 28 is 1.7 and extremely low in the sixth embodiment, a wire-to-wire parasitic capacitance produced between metal wires 28 is reduced. Although the dielectric constant of the first inter-layer dielectric 25 is 2.3 and slightly higher, the problem of an increased wire-to-wire parasitic capacitance produced between the metal wires 28 does not occur since the metal wires 28 are not formed in the first inter-layer dielectric 25.

Figure 5:
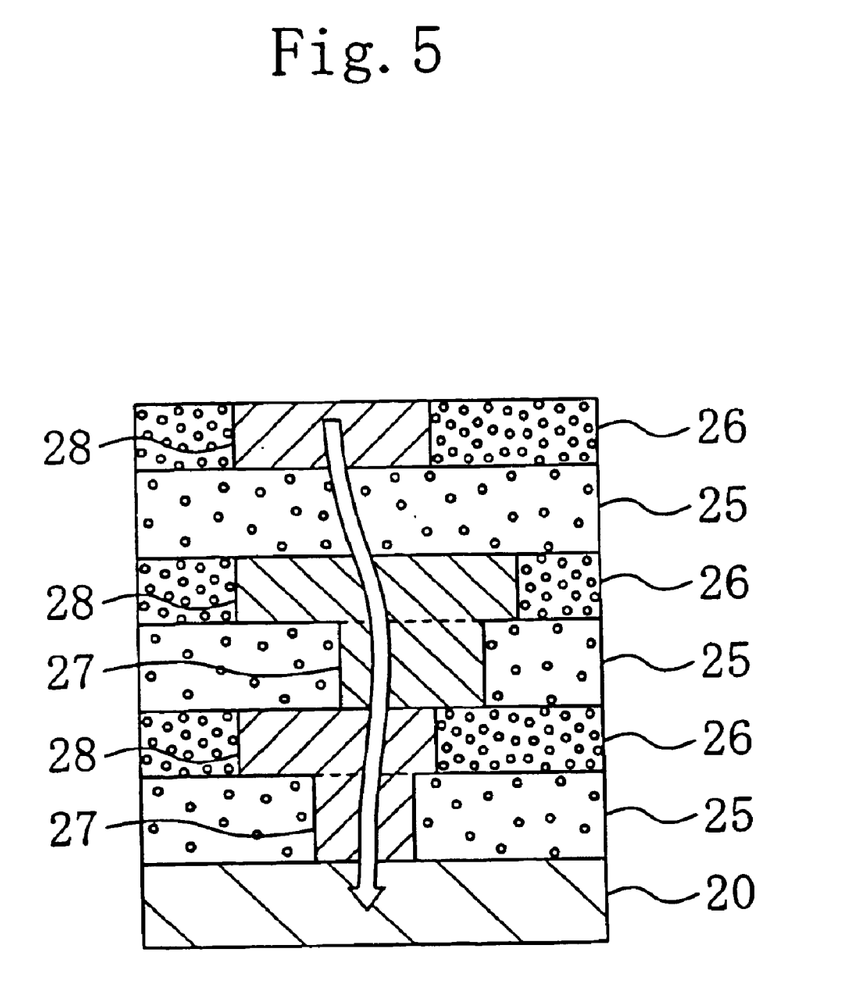
FIG. 5 is a cross-sectional view for illustrating heat diffusion in the wiring structure obtained according to the sixth embodiment.

FIG. 5 is a cross-sectional view for illustrating the excellent heat conductivity of a multilayer wiring structure obtained in accordance with the second embodiment, in which the first and second inter-layer dielectrics 25 and 26 are alternately formed on the semiconductor substrate 20. The contacts 27 are formed in the individual first inter-layer dielectrics 25, while the metal wires 28 are formed in the individual second inter-layer dielectrics 26.

Since the first inter-layer dielectric 25 is low in air content, the heat conductivity thereof is close to that of a silicon oxide film which has been used conventionally. Accordingly, a heat conduction path as indicated by the arrow in FIG. 5 is provided so that heat generated during the operation of an integrated circuit device is transmitted to the semiconductor substrate 20 and diffused efficiently. That is, if the inter-layer dielectrics are composed only of porous films having a high porosity, heat is vertically conducted via the metal wires 28 in the upper-layer portions of the inter-layer dielectrics in which the metal wires 28 are formed, while heat is less likely to be conducted in the lower portions of the inter-layer dielectrics in which the contacts 27 are formed, since the metal wires 28 are not present. In the multilayer wiring structure obtained in accordance with the sixth embodiment, on the other hand, the lower portions of the inter-layer dielectrics in which the contacts 27 are formed are composed of the first inter-layer dielectrics 25 excellent in heat conductivity, so that vertical heat conduction is not interrupted in the lower portions of the inter-layer dielectrics.

Figure 6A:
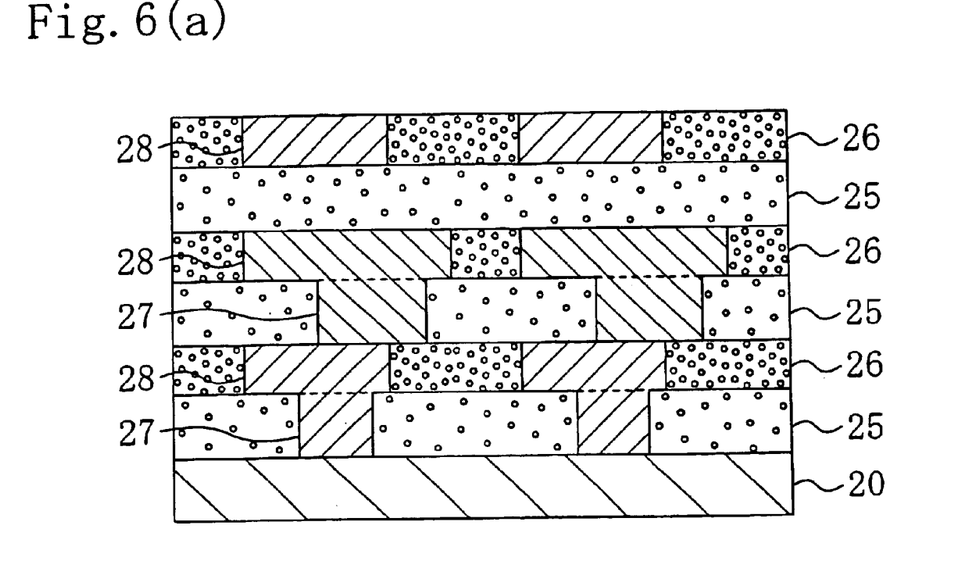
FIGS. 6(a) and (b) are cross-sectional views for illustrating the mechanical strength of the wiring structure obtained according to the sixth embodiment.
Figure 6B:
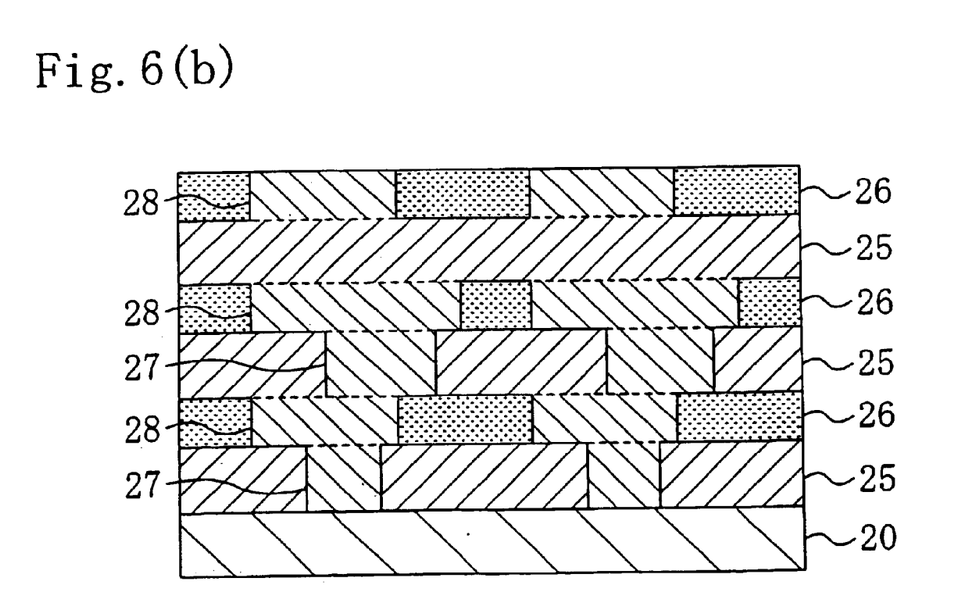

FIGS. 6(a) and (b) are cross-sectional views for illustrating the mechanical strength of the multilayer wiring structure obtained in accordance with the sixth embodiment, which is not inferior to the mechanical strength of a conventional multilayer wiring structure. As shown in the drawings, the first and second inter-layer dielectrics 25 and 26 are alternately formed on the semiconductor substrate 20. The contacts 27 are formed in the individual first inter-layer dielectrics 25, while the metal wires 28 are formed in the individual second inter-layer dielectrics 26.

Since the air content of each of the first inter-layer dielectrics 25 is 50%, the mechanical strength thereof is approximately equal to that of the silicon oxide film which has been used conventionally. By contrast, the air content of each of the second inter-layer dielectrics 26 is 85% so that the mechanical strength thereof is inferior to that of the silicon oxide film.

Nevertheless, the multilayer wiring structure obtained in accordance with the sixth embodiment is not inferior in mechanical strength to the conventional multilayer wiring structure using the silicon oxide films as the inter-layer dielectrics. Specifically, the hatched portions in FIG. 6(b) represent regions which are approximately equal in mechanical strength to the conventional multilayer wiring structure, while the dotted portions in FIG. 6(b) represent regions which are inferior in mechanical strength to the conventional wiring structure. As can be seen from FIG. 6(b), the regions which are inferior in mechanical strength are only those portions of the second inter-layer dielectrics 26 interposed between the metal wires 28, which are discontinued in either of horizontal and vertical directions. In other words, the regions which are excellent in mechanical strength are continued in either of horizontal and vertical directions, so that the multilayer wiring structure obtained in accordance with the sixth embodiment is not inferior in mechanical strength to the conventional multilayer wiring structure.

Embodiment 7

A method of forming a wiring structure according to a seventh embodiment of the present invention will be described with reference to FIGS. 7(a), (b), and (c) and 8(a), (b), and (c).

Figure 7A:
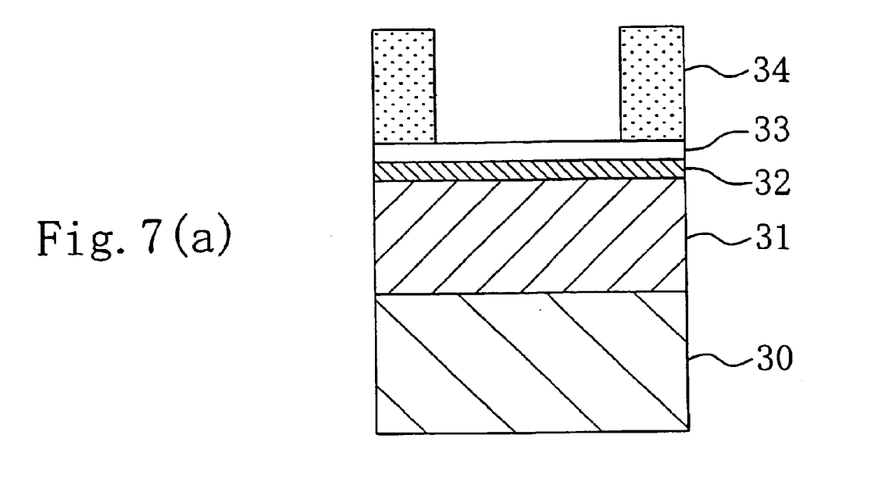
FIGS. 7(a), (b), and (c) are cross-sectional views illustrating the individual process steps of a method of forming a wiring structure according to a seventh embodiment of the present invention.

First, as shown in FIG. 7(a), an organic-inorganic hybrid film 31 having a siloxane skeleton and a thickness of, e.g., 400 nm is deposited on a semiconductor substrate 30 by the same plasma enhanced CVD as performed in the first embodiment. Then, a titanium nitride film 32 having a thickness of, e.g., 50 nm is deposited on the organic-inorganic hybrid film 31 by sputtering. Subsequently, a silicon oxide film 33 having a thickness of, e.g., 100 nm is deposited on the titanium nitride film 32 by sputtering and a resist pattern 34 having an opening over the region of the silicon oxide film 33 in which a wire is to be formed is formed on the silicon oxide film 33.

Figure 7B:
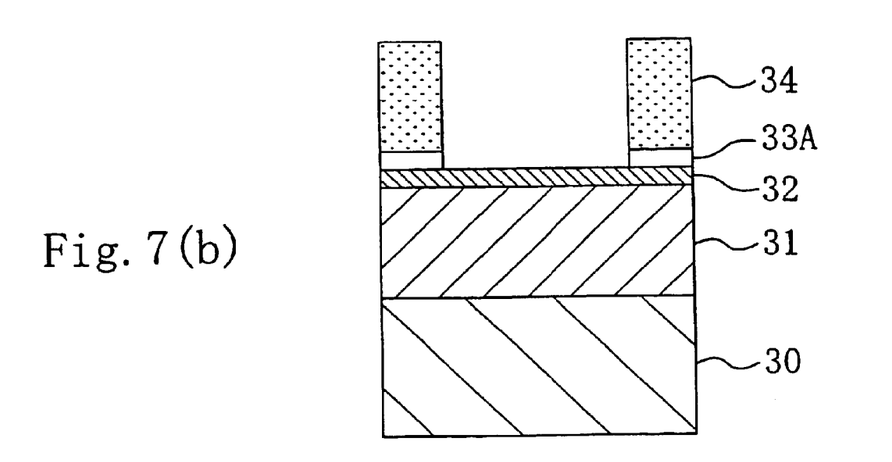
Figure 7C:
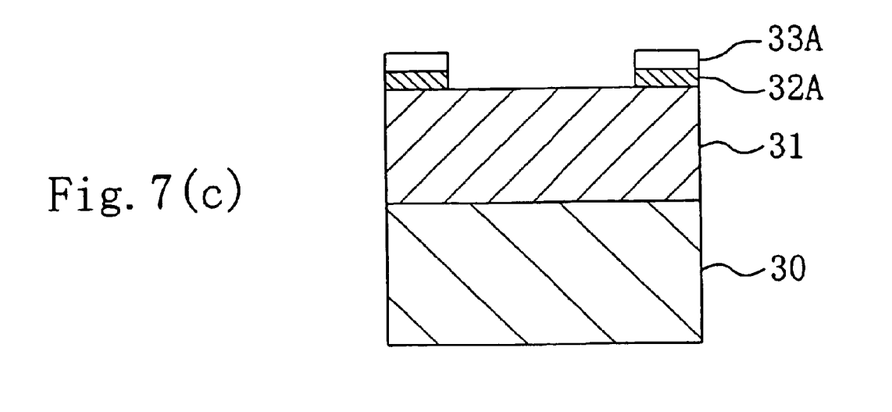

Next, as shown in FIG. 7(b), dry etching is performed with respect to the silicon oxide film 33 masked with the resist pattern 34 to form a patterned silicon oxide film 33A having the opening over the wire formation region. Then, as shown in FIG. 7(c), the resist pattern 34 is removed by ashing. Thereafter, dry etching is performed with respect to the titanium nitride film 32 masked with the patterned silicon oxide film 33A to form a hard mask 32A composed of the titanium nitride film 32.

Figures 8A, 8B, 8C:
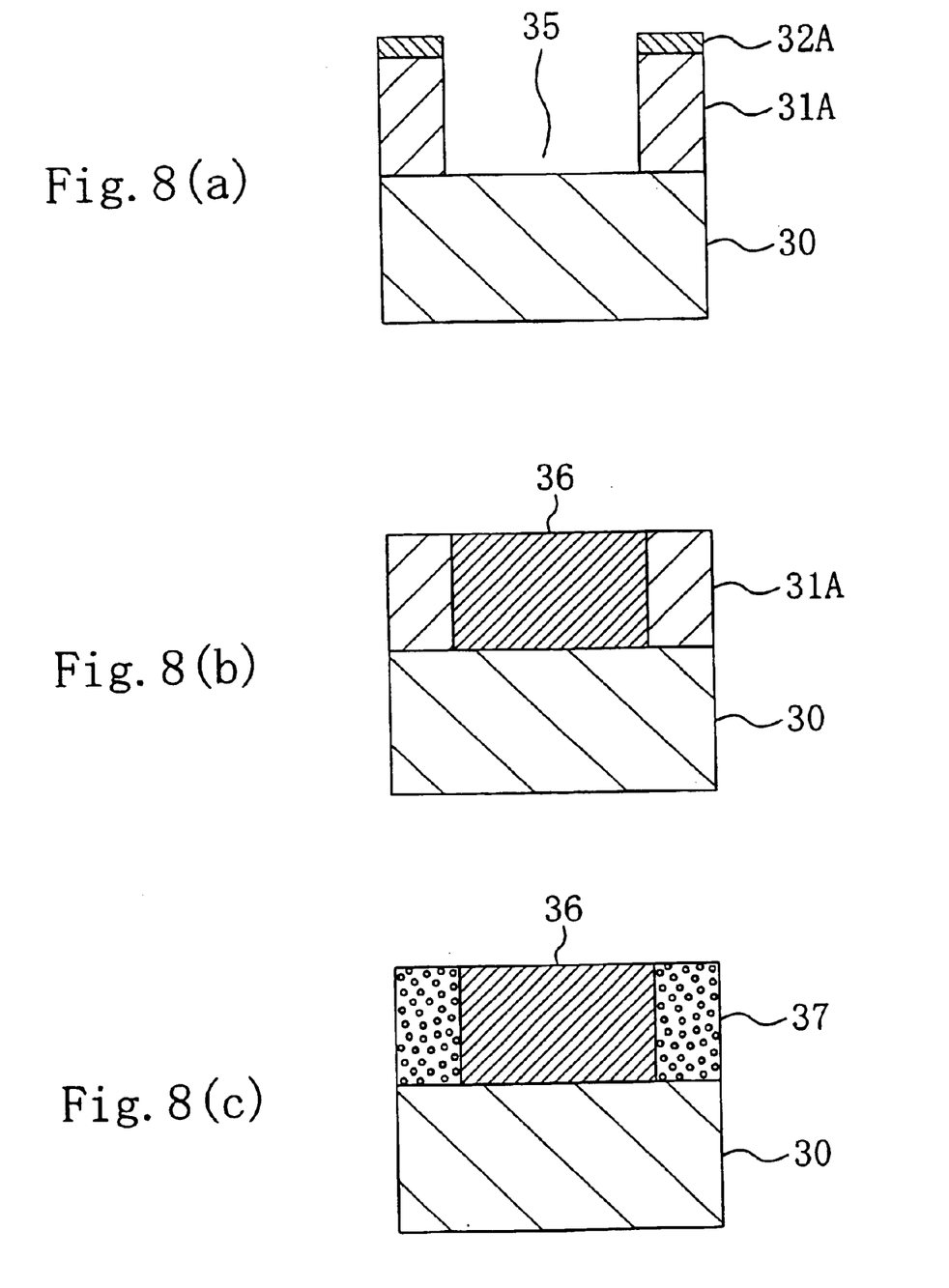

Next, as shown in FIG. 8(a), dry etching is performed with respect to the organic-inorganic hybrid film 31 by using the hard mask 32A to form a patterned organic-inorganic hybrid film 31A having a wire groove 35. It is to be noted that the patterned silicon oxide film 32A is removed in the dry etching step performed with respect to the organic-inorganic hybrid film 31.

Next, as shown in FIG. 8(b), a metal film such as a copper film is deposited on the patterned organic-inorganic hybrid film 31A to fill in the wire groove 35. After that, the metal film and the hard mask 32A overlying the patterned organic-inorganic hybrid film 31A are removed by CMP so that a buried wire 36 composed of the copper film is formed.

Next, the same hydrogen plasma process as performed in the first embodiment is performed with respect to the patterned organic-inorganic hybrid film 31A, whereby an inter-layer dielectric 37 composed of the patterned organic-inorganic hybrid film 31A is formed, as shown in FIG. 8(c).

A description will be given below to the characteristics of the method of forming a wiring structure according to the seventh embodiment.

First, since the inter-layer dielectric 37 composed of a porous film is formed by forming the buried wire 36 and then performing the hydrogen plasma process with respect to the patterned organic-inorganic hybrid film 31A, the metal composing the buried wire 36 is prevented from entering the fine holes of the porous film, which prevents an increased leakage current and a short circuit between the buried wires 36. Moreover, since it is unnecessary to form a protecting film composed of a silicon oxide film or the like on the wall faces of the wire groove and thereby prevent the metal film filled in the wire groove 35 from entering the portion of the porous film exposed in the wire groove, the wire-to-wire capacitance can surely be reduced.

Second, since CMP is performed with respect to the metal wire before the formation of the porous film composed of the patterned organic-inorganic hybrid film 31A, the surface of the metal film filled in the wire groove 35 which is in contact with the patterned organic-inorganic hybrid film 31A becomes flat, which improves the orientation property of the metal composing the metal film and therefore there liability of the buried wires 36. Moreover, since CMP is performed with respect to the organic-inorganic hybrid film having a higher mechanical strength than a porous film, there can be prevented a situation where an inter-layer dielectric composed of a porous film is destroyed in the CMP step. Furthermore, since a polishing slurry and fine particles contained in the slurry are prevented from entering the fine holes of the porous film in the CMP step, there can be prevented the degradation of the inter-layer dielectric and the generation of particles.

What is claimed is:

1. A wiring structure comprising:
   a first inter-layer dielectric formed on a substrate and having a contact hole, said first inter-layer dielectric being composed of a porous film having a relatively low porosity;
   a second inter-layer dielectric formed on said first inter-layer dielectric and having a wire groove, said second inter-layer dielectric being composed of a porous film having a relatively high porosity;
   a contact composed of a metal film filled in said contact hole; and
   a metal wire composed of a metal film filled in said wire groove.

2. The structure of claim 1, wherein the porous film is formed by performing a plasma process using a plasma derived from a gas containing a reducing gas with respect to an organic-inorganic hybrid film.

3. The structure of claim 2, wherein the organic-inorganic hybrid film is deposited by plasma enhanced CVD using a gas mixture of a silicon alkoxide and an organic compound as a reactive gas.

4. The structure of claim 3, wherein the silicon alkoxide is an organic silicon alkoxide represented by the general formula: $R^1Si(OR^2)_3$ where $R^1$ and $R^2$ are the same or different, each representing an alkyl group or an aryl group.

5. The structure of claim 3, wherein the reducing gas contains a hydrogen gas or an ammonia gas.

6. The stricture of claim 2, wherein the organic-inorganic hybrid film has a siloxane skeleton.

7. The structure of claim 6, wherein the reducing gas contains a nitrogen atom.

8. The structure of claim 7, wherein the reducing gas contains an ammonia gas.

9. The structure of claim 6, wherein the reducing gas contains a hydrogen atom.

10. The structure of claim 9, wherein the reducing gas contains a hydrogen gas or an ammonia gas.

11. The structure of claim 1, wherein the porous film is formed by performing a thermal treatment in an atmosphere containing a reducing gas with respect to the organic-inorganic hybrid film.

12. The structure of claim 11, wherein the organic-inorganic hybrid film is deposited by plasma enhanced CVD using a gas mixture of a silicon alkoxide and an organic compound as a reactive gas.

13. The structure of claim 12, wherein the silicon alkoxide is an organic silicon alkoxide represented by the general formula: $R^1Si(OR^2)_3$ where $R^1$ and $R^2$ are the same or different, each representing an alkyl group or an aryl group.

14. The structure of claim 12, wherein the reducing gas contains a hydrogen gas or an ammonia gas.

* * * * *